United States Patent
Chiu et al.

(10) Patent No.: US 11,967,510 B2
(45) Date of Patent: Apr. 23, 2024

(54) CHIP, HEATING CIRCUIT AND HEATING CONTROL METHOD FOR CHIP

(71) Applicant: Nuvoton Technology Corporation, Hsinchu Science Park (TW)

(72) Inventors: Wei-Hang Chiu, Taoyuan (TW); Chieh-Sheng Tu, Hsinchu (TW)

(73) Assignee: NUVOTON TECHNOLOGY CORPORATION, Hsinchu Science Park (TW)

(*) Notice: Subject to any disclaimer, the term of this patent is extended or adjusted under 35 U.S.C. 154(b) by 663 days.

(21) Appl. No.: 17/039,871

(22) Filed: Sep. 30, 2020

(65) Prior Publication Data
US 2021/0202279 A1 Jul. 1, 2021

(30) Foreign Application Priority Data
Dec. 27, 2019 (TW) .................................. 108148014

(51) Int. Cl.
*H01L 21/67* (2006.01)
*H05B 3/00* (2006.01)

(52) U.S. Cl.
CPC ..... *H01L 21/67098* (2013.01); *H05B 3/0047* (2013.01)

(58) Field of Classification Search
CPC . H01L 21/67098; H05B 3/0047; H05B 1/023; G05D 23/24
See application file for complete search history.

(56) References Cited

FOREIGN PATENT DOCUMENTS

| CN | 101192597 A | * | 6/2008 |
| CN | 101192597 A | | 6/2008 |
| CN | 101421895 A | | 4/2009 |
| CN | 105743416 A | | 7/2016 |
| CN | 209592967 U | | 11/2019 |
| TW | 200709527 A | | 3/2007 |

OTHER PUBLICATIONS

Office Action, with Search Report, issued in corresponding TW patent application No. 108148014 dated Jun. 29, 2020.

* cited by examiner

Primary Examiner — John P. Dulka
(74) Attorney, Agent, or Firm — Muncy, Geissler, Olds & Lowe, P.C.

(57) ABSTRACT

A heating circuit is provided. The heating circuit is disposed in a chip which has a normal operation temperature range. The heating circuit includes a comparison circuit and a thermal-energy generation circuit. The comparison circuit compares a temperature voltage with a first threshold voltage. The temperature voltage represents a temperature of the chip. The thermal-energy generation circuit is controlled by the comparison circuit. When the temperature voltage is less than the first threshold voltage, the comparison circuit enables the thermal-energy generation circuit to generate thermal energy to raise the temperature of the chip.

20 Claims, 5 Drawing Sheets

CHIP, HEATING CIRCUIT AND HEATING CONTROL METHOD FOR CHIP

CROSS REFERENCE TO RELATED APPLICATIONS

This application claims priority of Taiwan Patent Application No. 108048014, filed on Dec. 27, 2019, the entirety of which is incorporated by reference herein.

BACKGROUND OF THE INVENTION

Field of the Invention

The present invention relates to a chip, and more particularly to a chip having an internal heating circuit.

Description of the Related Art

A processor, such as a microcontroller unit (MCU), has a normal operation temperature range. For example, in general, the normal operation temperature range of a non-industrial-grade processor is −25° C.~105° C., and the normal operation temperature range of an industrial-grade processor is −40° C.~105° C. However, at high latitudes, temperatures are often lower than −40° C. When the temperature of the environment in which a chip is located is lower than −40° C., the temperature of the chip is also lower than −40° C. Under those conditions, the processor in the chip cannot operate normally, which makes the chip unable to boot up. Therefore, in regions of high latitude and other environments with extremely low temperatures, the use of electronic devices is subject to many restrictions.

BRIEF SUMMARY OF THE INVENTION

Therefore, the present invention provides a chip with an internal heating circuit, which can automatically heat the chip in a low-temperature environment, so that the chip temperature rises to a normal working range and then the chip is boosted up, which ensures that the chip can operate at its normal temperature.

An embodiment of the present invention provides a heating circuit. The heating circuit is disposed in a chip which has a normal operation temperature range. The heating circuit comprises a comparison circuit and a thermal-energy generation circuit. The comparison circuit compares a temperature voltage with a first threshold voltage. The temperature voltage represents a temperature of the chip. The thermal-energy generation circuit is controlled by the comparison circuit. When the temperature voltage is less than the first threshold voltage, the comparison circuit enables the thermal-energy generation circuit to generate thermal energy to raise the temperature of the chip.

An embodiment of the present invention provides a chip. The chip comprises a temperature sensor, a heating circuit, and a processor. The temperature sensor senses a temperature of the chip to generate a temperature voltage. The heating circuit receives the temperature voltage. The heating circuit compares the temperature voltage with a first threshold voltage to generate a heating control signal. The heating circuit further compares the temperature voltage with a second threshold voltage and generates a comparison signal according to a comparison result between the temperature voltage and the second threshold voltage. The first threshold voltage is greater than the second threshold voltage. The processor is coupled to the heating circuit. The heating circuit provides the comparison signal as a reset signal to the processor. When the temperature voltage is less than the first threshold voltage, the heating circuit generates thermal energy to heat the chip according to the heating control signal. When the temperature voltage is less than the second threshold voltage, the reset signal has a disabled voltage level to stop the processor from operating.

Another embodiment of the present invention provides a heating control method for a chip. The heating control method comprises the steps of sensing a temperature of the chip; determining whether the temperature of the chip is higher than a first threshold temperature; determining whether the temperature of the chip is higher than a second temperature, wherein the second threshold temperature is lower than the first threshold temperature; in response to the temperature of the chip not being higher than the first threshold temperature, generating thermal energy to heat the chip; and in response to the temperature of the chip not being higher than the second threshold temperature, not boosting up the chip.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
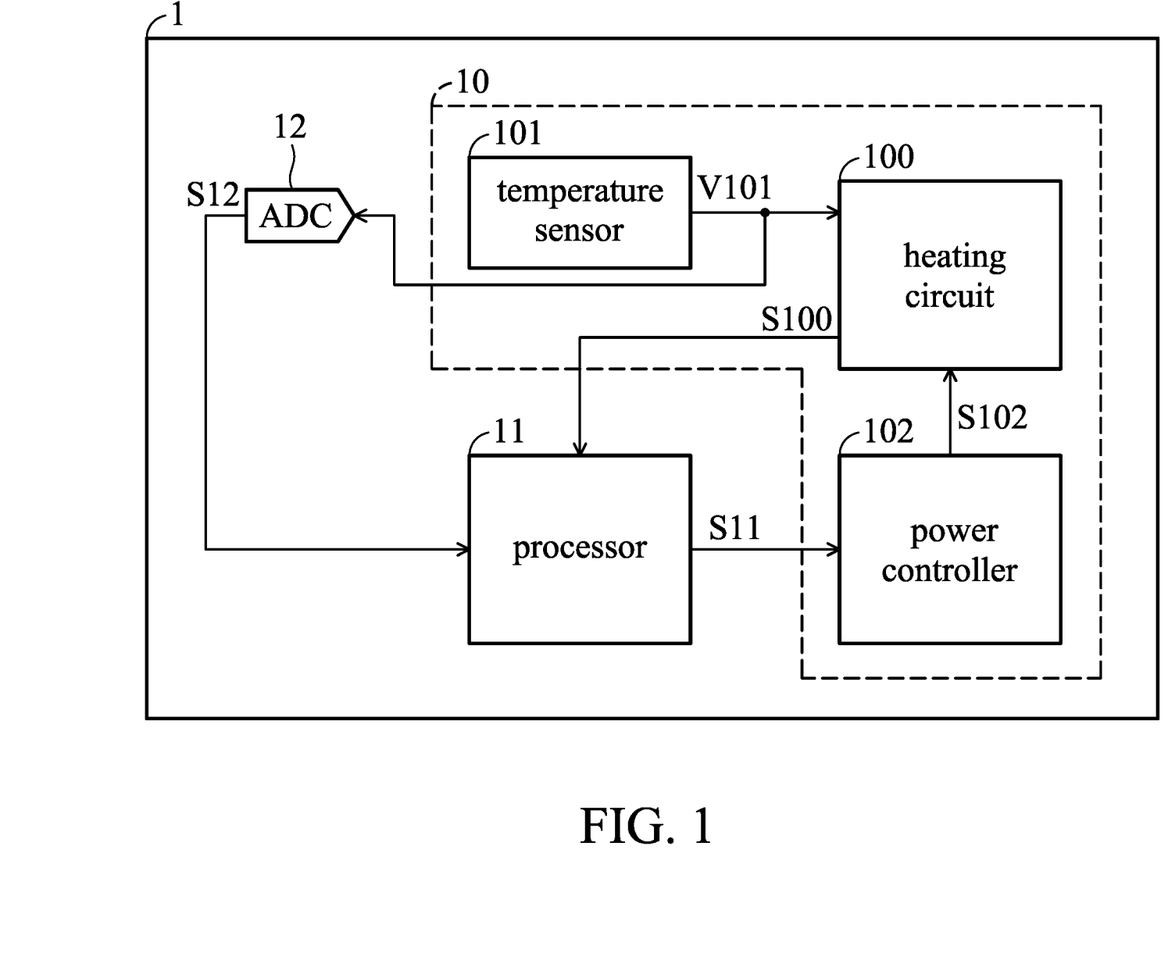
FIG. 1 shows a chip according to an exemplary embodiment of the present invention.

FIG. 1 shows a chip according to an exemplary embodiment of the present invention. Referring to FIG. 1, a chip 1 comprises a heating module 10, a processor 11, and an analog-to-digital converter (ADC) 12. The heating module 10, the processor 11, and the ADC 12 are disposed on the same substrate, that is, the substrate of the chip 1. In an embodiment, the processor 11 is, for example, a microcontroller unit (MCU). The processor 11 has a preset normal operation temperature range. The heating module 10 comprises a heating circuit 100, a temperature sensor 101, and a power controller 102. When a power supply voltage is provided to the chip 1 (that is, when the chip 1 is powered on), the temperature sensor 101 senses the temperature of the chip 1 and generates a temperature voltage according to the sensed temperature. In an embodiment, the temperature sensor 101 may comprise a thermistor. The resistance value of this thermistor changes with its ambient temperature (i.e. the temperature of the chip 1). Therefore, the temperature sensor 101 generates a temperature voltage V101 according to the power supply voltage and the resistance value of the thermistor to indicate the temperature of the chip 1. For example, the temperature voltage V101 is proportional to the temperature of the chip 1. The temperature sensor 101 provides the temperature voltage V101 to the ADC 12 and the heating circuit 100. The heating circuit 100 compares the temperature voltage V101 with a threshold voltage $V_{SHTT}$ (shown in FIG. 2; SHTT: Stop Heating Temp. Threshold). The threshold voltage $V_{SHTT}$ corresponds to the stop-heating temperature threshold value of the heating circuit 100, and the stop-heating temperature threshold value may be determined according to system requirements. For example, the threshold voltage $V_{SHTT}$ is proportional to the stop-heating temperature threshold value and is determined based on the temperature-voltage relationship of the temperature sensor 101. The heating circuit 100 determines whether thermal energy is generated to heat the chip 1 based on a comparison result between the temperature voltage V101 and the threshold voltage VSHTT. When the heating circuit 100 generates thermal energy, the temperature of the chip 1 rises in response to the thermal energy. The heating circuit 100 also compares the temperature voltage V101 with a threshold voltage VCBTT (shown in FIG. 2; CBTT: Chip Boost-Up Temp. Threshold). The threshold voltage VCBTT corresponds to the boosting-up temperature threshold value of the chip 1, and the boosting-up temperature threshold value is determined according to the operation characteristics of the chip 1. For example, the threshold voltage VCBTT is proportional to the boosting-up temperature threshold and is determined based on the temperature-voltage relationship of the temperature sensor 101. The heating circuit 100 generates a reset signal S100 according to the comparison result between the temperature voltage V101 and the threshold voltage VCBTT, so as to enable the processor 11 to operate or disable the processor 11 to stop it from operating, thereby boosting up or not boosting up the chip 1.

When the chip 1 is boosted up, the ADC 12 samples the temperature voltage V101 at a preset sampling frequency, thereby converting the temperature voltage V101 into a digital temperature signal S12. The processor 11 generates a thermal-energy control signal S11 to the power controller 102. The power controller 102 generates a corresponding power adjustment signal S102 according to the thermal-energy control signal S11. The heating circuit 100 adjusts the amount of thermal energy generated by itself according to the power adjustment signal S102, that is, the heating circuit controls the heating power for the chip 1. The processor 11 receives the digital temperature signal S12 and obtains the temperature of the chip 1 according to the digital temperature signal S12. By continuously monitoring the temperature of the chip 1, the processor 11 can adjust the value of the thermal-energy control signal S11, thereby changing the power adjustment signal S102. In this way, the thermal energy generated by the heating circuit 100 is increased or decreased accordingly, so that the temperature of the chip 1 can be maintained within a preset temperature range or at a specific temperature within the preset temperature range. In the embodiment, the preset temperature range is within the normal operation temperature range of the processor 11.

The detailed operations of the heating module 10, the processor 11, and the ADC 12 and the detailed structure of the heating circuit 100 will be described below with reference to FIGS. 1 to 3B.

Figure 2:
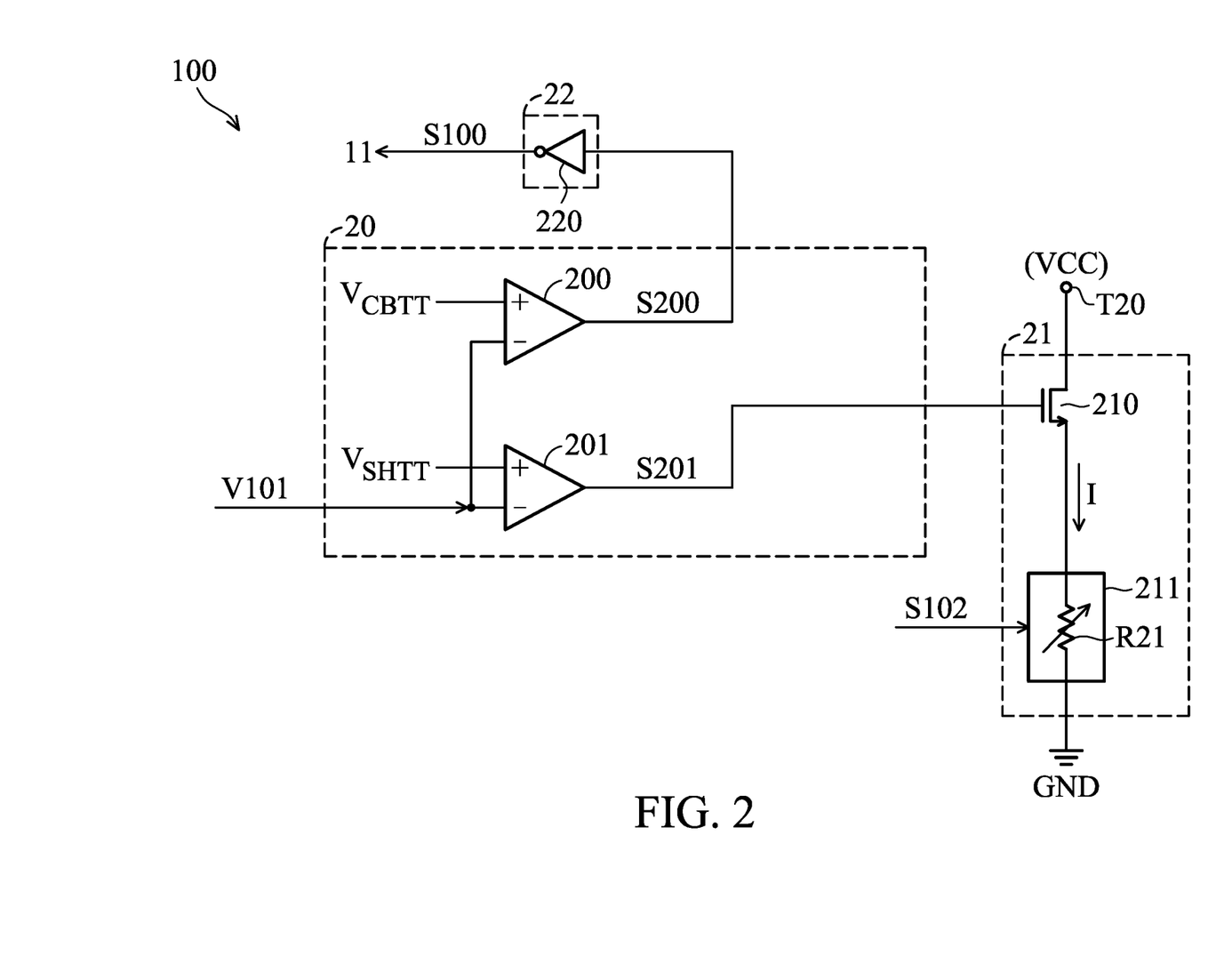
FIG. 2 shows a chip according to another exemplary embodiment of the present invention.

Referring to FIG. 2, the heating circuit 100 comprises a comparison circuit 20, a thermal-energy generation circuit 21, and a resetting control circuit 22. The comparison circuit 20 comprises comparators 200 and 201. The positive input terminal (+) of the comparator 200 receives the threshold voltage $V_{CBTT}$, the negative input terminal (−) thereof receives the temperature voltage V101, and the output terminal thereof generates a comparison signal S200. The positive input terminal (+) of the comparator 201 receives the threshold voltage $V_{SHTT}$, the negative input terminal (−) thereof receives the temperature voltage V101, and the output terminal thereof generates a comparison signal S201 which serves as a heating control signal.

The thermal-energy generation circuit 21 comprises a transistor 210 and a load circuit 211. In the embodiment of FIG. 2, the transistor 210 is implemented by an N-type transistor. Referring to FIG. 2, the gate (control electrode) of the transistor 210 receives the heating control signal (i.e. the comparison signal) S201, and the drain (input electrode) thereof is coupled to a power source terminal T20. The load circuit 211 is coupled between a source (output electrode) of the transistor 210 and a ground terminal GND. In the embodiment, the load circuit 211 comprises a variable resistor R21, which is coupled between the source of the transistor 210 and the ground terminal GND. The load circuit 211 receives the power adjustment signal S102 from the power controller 102 and is controlled by the power adjustment signal S102 to change the resistance value of the variable resistor R21.

The reset control circuit 22 receives the comparison signal S200 and generates the reset signal S100 according to the comparison signal S200. In the embodiment of FIG. 2, the reset control circuit 22 comprises an inverter 220. The input terminal of the inverter 220 receives the comparison signal S200, and the output terminal thereof generates the reset signal S100. Therefore, the reset signal S100 and the comparison signal S200 are out of phase.

According to an embodiment, the normal operation temperature range of the processor 11 is −40° C.~105° C., the boosting-up temperature threshold value of the chip 1 is set to the lower limit value of the normal operation temperature range, −40° C., and the stop-heating temperature threshold value set to −34° C., and the preset temperature range is set to −40° C.~−34° C. In this embodiment, the threshold voltage $V_{SHTT}$ corresponding to the stop-heating temperature threshold value (−34° C.) is set to be larger than the threshold voltage VCBTT corresponding to the boosting-up temperature threshold value (−40° C.).

The detailed operations of the heating module 10, the processor 11, and the ADC 12 will be described below using the above parameters as examples.

Figure 3A:
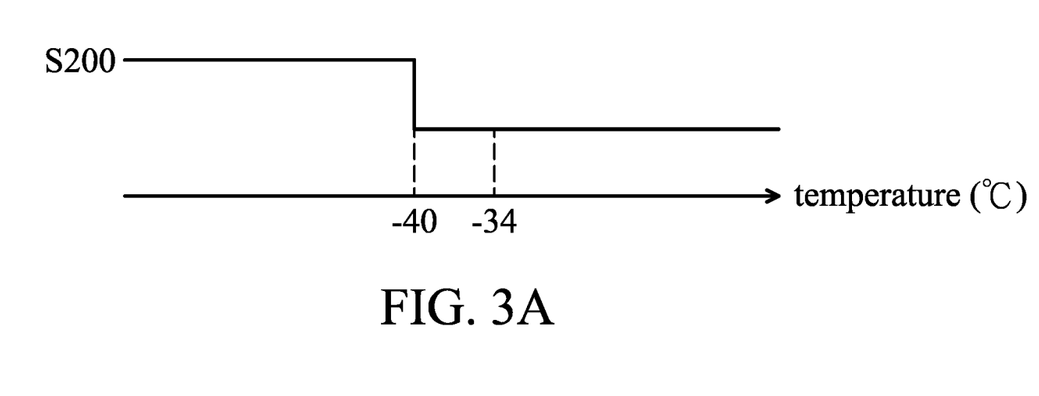
FIGS. 3A to 3B are waveform diagrams of main signals of a heating circuit according to an exemplary embodiment of the present invention.
Figure 3B:
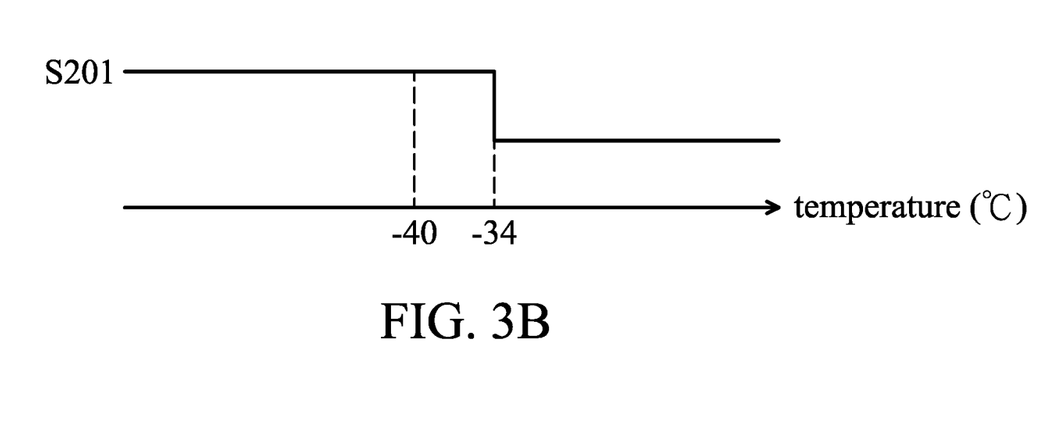

In an example, it is assumed that the temperature of the environment in which the chip 1 is located is −50° C. When the power supply voltage VCC has not been supplied to the chip 1 (that is, when the chip 1 is not powered on), the temperature of the chip 1 is equal to the environment temperature (−50° C.). When the power supply voltage VCC is supplied to the chip 1 (i.e. when the chip 1 is powered on), the temperature sensor 101 generates the temperature voltage V101 according to the temperature of the chip 1. The comparators 200 and 201 receive the temperature voltage V101. At this time, the temperature of the chip 1 is still −50° C., which is lower than the stop-heating temperature threshold value (−34° C.) and the boosting-up temperature threshold value (−40° C.). In such cases, the temperature voltage V101 is smaller than the threshold voltage $V_{CBTT}$, and the comparator 200 generates the comparison signal S200 with a high voltage level, as shown in FIG. 3A. In addition, the temperature voltage V101 is also smaller than the threshold voltage $V_{SHTT}$, and, as shown in FIG. 3B, the comparator 201 generates the heating control signal S201 with a high voltage level to enable the thermal-energy generation circuit 21. In detail, the transistor 210 is turned on according to the heating control signal S201 with the high voltage level to generate a current I. The current I flows through the variable resistor R21 of the load circuit 211. Based on the principle of converting electrical energy to thermal energy, the current I flowing through the variable resistor R21 causes thermal energy (the thermal effect of the current). The chip 1 is heated by this thermal energy, so that the temperature of the chip 1 starts to gradually rise from −50° C. At this time, the thermal-energy generation circuit 21 heats the chip 1 with full heating power.

In addition, the inverter 220 of the resetting control circuit 22 also receives the comparison signal S200. When the temperature of the chip 1 is lower than the boosting-up temperature threshold value (−40° C.), the inverter 220 converts the comparison signal S200 with a high voltage level to the reset signal S100 with a low voltage level (or, referred to as a disabled voltage level), thereby disabling the processor 11 to stop it from operating. As a result, the chip 1 is not boosted.

When the temperature of the chip 1 starts to gradually rise from −50° C. to a temperature point which is higher than the boosting-up temperature threshold value (−40° C.) but is lower than the stop-heating temperature threshold value (−34° C.), the temperature voltage V101 is greater than the threshold voltage $V_{CBTT}$ and less than the threshold voltage $V_{SHTT}$. At this time, as shown in FIGS. 3A and 3B, the comparison signal S200 generated by the comparator 200 is switched from the high voltage level to a low voltage level, and the comparator 201 continuously generates the heating control signal S S201 with the high voltage level. The transistor 210 is maintained at the turned-on state according to the heating control signal S201 with the high voltage level, so as to continuously generate thermal energy to heat the chip 1.

In addition, when the temperature of the chip 1 is higher than the boosting-up temperature threshold value (−40° C.) but is lower than the stop-heating temperature threshold value (−34° C.), the inverter 220 converts the comparison signal S200 with the low voltage level to the reset signal S100 with a high voltage level (also referred to as an enable voltage level), thereby enabling the processor 11 to operate. Accordingly, the chip 1 is boosted up. Since the processor 11 starts operating, the ADC 12 also starts operating. The ADC 12 samples the temperature voltage V101 at the preset sampling frequency, thereby converting the temperature voltage V101 into the digital temperature signal S12. The processor 11 monitors the temperature of the chip 1 according to the digital temperature signal S12 and adjusts the value of the thermal-energy control signal S11, which is generated by the chip 1, according to the temperature of the chip 1. The power controller 102 determines the value of the variable resistor R21 according to the value of the thermal-energy control signal S11 and changes the power adjustment signal S102 according to the determined value of the variable resistor R21. The variable resistor R21 changes its resistance value according to the power adjustment signal S102, thereby adjusting (increasing or decreasing) the thermal energy generated by the thermal-energy generation circuit 21, so that the temperature of the chip 1 can be maintained within the preset temperature range (−40° C.~−34° C.) or at the specific temperature within the preset temperature range, such as −36° C.

In another example, it is assumed that the temperature of the environment in which the chip 1 is located is −25° C. When the power supply voltage VCC has not been supplied to the chip 1, the temperature of the chip 1 is equal to the environment temperature (−25° C.). When the power supply voltage VCC is supplied to the chip 1 (i.e. when the chip 1 is powered on), the temperature sensor 101 generates the temperature voltage V101 according to the temperature of the chip 1. The comparators 200 and 201 receive the temperature voltage V101. At this time, the temperature of the chip 1 is higher than both of the stop-heating temperature threshold value (−34° C.) and the boosting-up temperature threshold value (−40° C.). In such cases, the temperature voltage V101 is greater than the threshold voltage $V_{CBTT}$, and, as shown in FIG. 3A, the comparator 200 generates the comparison signal S200 with the low voltage level. In addition, the temperature voltage V101 is also greater than the threshold voltage $V_{SHTT}$, and, as shown in FIG. 3B, the comparator 201 generates the heating control signal S201 with a low voltage level to disable the thermal-energy generation circuit 21. In detail, the transistor 210 is not turned off according to the heating control signal S201 with the low voltage level. Therefore, no current flows through the variable resistor R21, so that the thermal-energy generation circuit 21 does not generate thermal energy at this time. In other words, the heat generation circuit 21 is off, and the chip 1 is not heated by the thermal-energy generation circuit 21. In addition, the inverter 220 converts the comparison signal S200 with the low voltage level into the reset signal S100 with the high voltage level, thereby enabling the processor 11 to operate. Accordingly, the chip 1 is boosted up. In this example, since the thermal-energy generation circuit 21 is off, even if the chip 1 is boosted up, it does not need to adjust thermal energy.

According to the above embodiments, the chip 1 comprises a built-in heating circuit 100, which can automatically heat the chip 1 when the chip 1 is powered on in the situation that the environment temperature is lower than the lower limit value of the normal operation temperature range, so that the temperature of the chip 1 rises to a temperature within the normal operation temperature range. In addition, when the temperature of the chip 1 rises above the lower limit value of the normal operation temperature range, the processor 11 can adjust the heating power of the heating circuit 100 for the chip 1 to maintain the temperature of the chip 1 within the preset temperature range or at the preset temperature.

Figure 4:
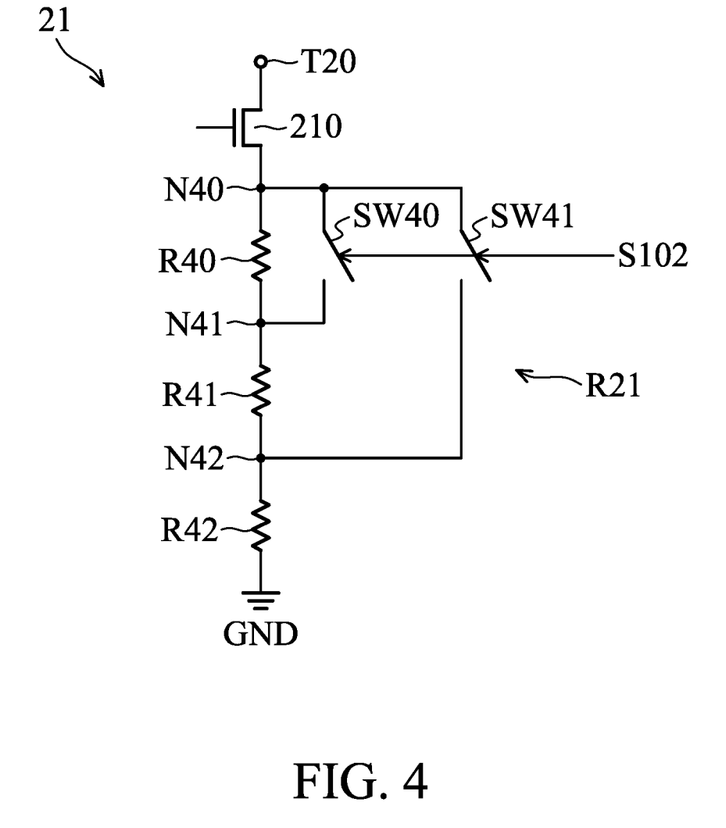
FIG. 4 shows a thermal-energy generation circuit according to an exemplary embodiment of the present invention.

In one embodiment, the variable resistor R21 may be composed of a plurality of resistors and a plurality of switches. As shown in FIG. 4, in this embodiment, three resistors R40~R42 and two switches SW40~SW41 are taken as an example for illustration. Referring to FIG. 4, the resistors R40~R42 are connected in series between a node N40 and the ground terminal GND. The switch SW40 is coupled between the nodes N40 and N41, and the switch SW41 is coupled between the nodes N40 and N42. The switches SW40 and SW41 are controlled by the power adjustment signal S102. When the processor 11 operates, the on/off states of the switches SW40 and SW41 is controlled by the power adjustment signal S102, and the number of resistors connected in series between the node N40 and the ground terminal GND is changed, thereby changing the resistance value of the variable resistor R21 and adjusting the thermal energy (that is, adjusting the heating power for the chip 1).

Figure 5:
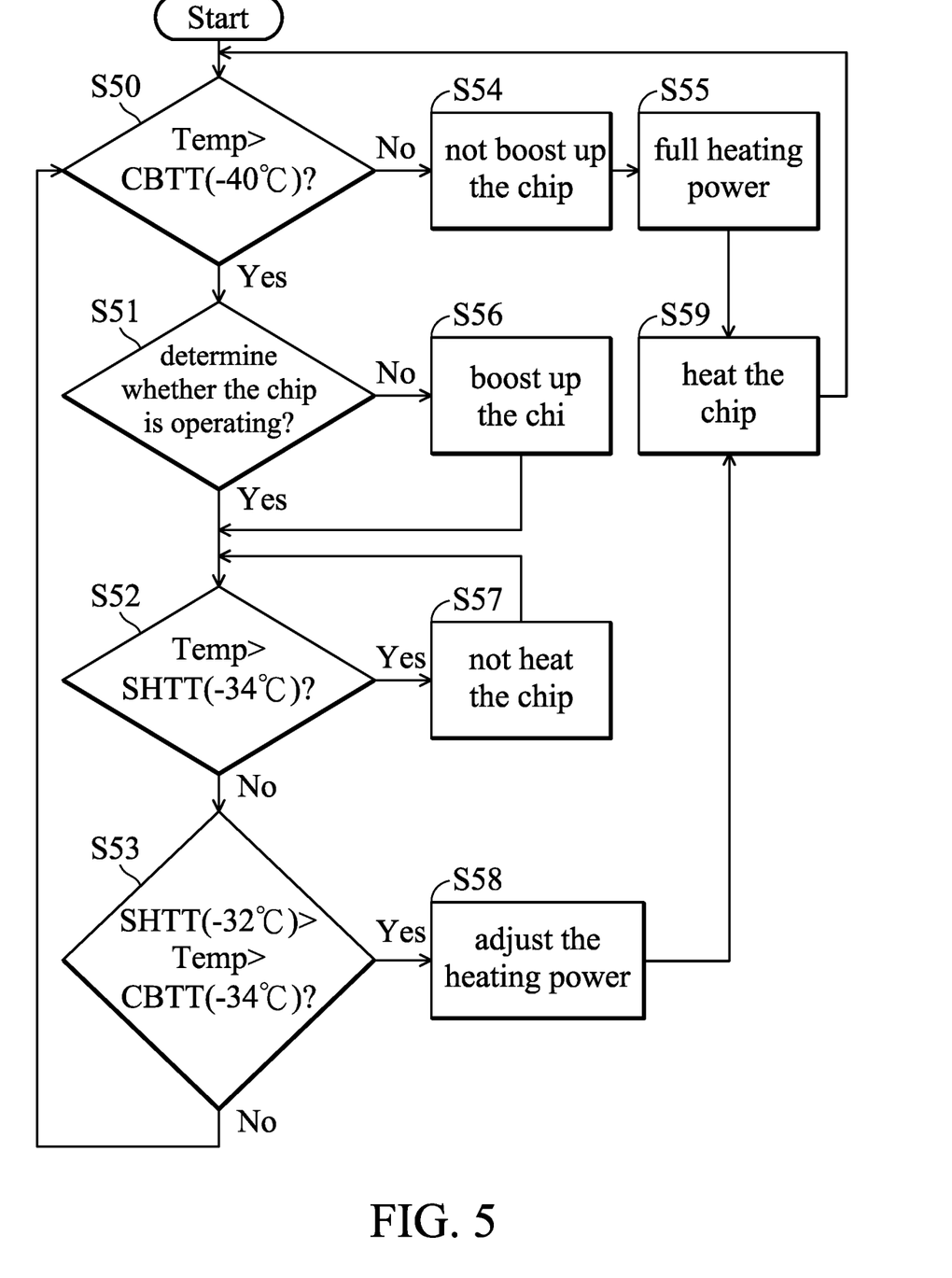
FIG. 5 is a flow chart illustrating a heating control method according to an exemplary embodiment of the present invention.

FIG. 5 is a flow chart illustrating a heating control method according to an exemplary embodiment of the present invention. The heating control method is used for the chip 1 shown in FIG. 1. In an example, it is assumed that the temperature of the environment in which the chip 1 is located is −50° C. When the power supply voltage VCC has not been supplied to the chip 1 (that is, when the chip 1 is not powered on), the temperature of the chip 1 is equal to the environment temperature (−50° C.). When the power supply voltage VCC is supplied to the chip 1 (that is, when the chip 1 is powered on), the heating circuit 100 first determines whether the temperature Temp of the chip 1 is higher than the boosting-up temperature threshold value CHTT (−40° C.) (Step S50: Temp>CBTT (−40° C.)?). Since the temperature Temp at this time is not higher than (i.e. lower than) the threshold temperature threshold value CHTT (Step S50—No), Step S54 is performed. In Step S54, the heating circuit 100 disables the processor 11 through the reset signal S100 to stop it from operating, thereby not boosting up the chip 1. In addition, the thermal-energy generation circuit 21 of the heating circuit 100 operates at full heating power (Step S55) to heat the chip 1 (Step S59), so that the temperature of the chip 1 starts to gradually rise from −50° C. After that, the heating control method returns to Step S50 to continuously determine whether the temperature Temp is higher than the boosting-up temperature threshold value CHTT.

The chip 1 is continuously heated by the heating circuit 100. When the temperature Temp of the chip 1 gradually rises from −50° C. to a temperature which exceeds the boosting-up temperature threshold value CHTT (−40° C.), it is determined whether the chip 1 is operating (Step S51). If it is determined that the chip 1 is not operating (Step S51—No), the chip 1 is boosted up (Step S56). After the chip 1 is boosted up, the heating control method proceeds to Step S52. If it is determined that the chip 1 is operating (step S51—YES), the heating control method proceeds to Step S52. In Step S52, the heating circuit 100 determines whether the temperature Temp is higher than the stop-heating temperature threshold value SHTT (−34° C.) (Step S52: Temp>SHTT (−34° C.)?). During the period in which the temperature Temp rises continuously due to the heating, when the temperature Temp is not higher than the stop-heating temperature threshold value SHTT (Step S52—No), the heating circuit 100 determines whether the temperature Temp is higher than the boosting-up temperature threshold CHTT voltage (−40° C.)) but lower than the stop-heating temperature threshold value SHTT (−34° C.) (Step S53: SHTT (−34° C.)>Temp>CBTT (−40° C.)?). When it is determined whether the temperature Temp is higher than the boosting-up temperature threshold value CHTT but lower than the stop-heating temperature threshold value SHTT (Step S53—Yes), the heating power of the heating circuit 100 is adjusted (Step S58), and the chip 1 is heated by the adjusted heating power (Step S59). After Step S59, the heating control method returns to Step S50. Through Step S50~S53 and S58~S59, the temperature Temp of the chip 1 can be maintained within a preset temperature range of −34° C. to −40° C. or maintained at a preset temperature within the range of −34° C. to −40° C., such as −36° C.

In another example, it is assumed that the temperature of the environment in which the chip 1 is located is −25° C. When the power supply voltage VCC has not been supplied to the chip 1 (that is, when the chip 1 is not powered on), the temperature of the chip 1 is equal to the environment temperature (−25° C.). When the power supply voltage VCC is supplied to the chip 1 (that is, when the chip 1 is powered on), the heating circuit 100 first determines whether the temperature Temp of the chip 1 is higher than the boosting-up temperature threshold value CHTT (−40° C.) (Step S50: Temp>CBTT (−40° C.)?). Since the temperature Temp at this time is higher than the boosting-up temperature threshold value CHTT (Step S50-Y), the heating control method proceeds to Step S51. In Step S51, it is determined whether the chip 1 is operating. If it is determined that the chip 1 is not operating (Step S51—No), the chip 1 is boosted up (Step S56). After the chip 1 is boosted up, the heating control method proceeds to Step S52. If it is determined that the chip 1 is operating (step S51—YES), the heating control method proceeds to Step S52. In step S52, the heating circuit 100 determines whether the temperature Temp is higher than the stop-heating temperature threshold value SHTT (−34° C.). Since the environment temperature is up to −25° C., the temperature Temp at this time is higher than the stop-heating temperature threshold value SHTT (Step S52-Y). Next, in Step S57, the power supply voltage VCC is stopped from being provided to the heating circuit 100, so that the heating circuit 100 does not generate thermal energy, that is, the chip is not heated by the heating circuit 100.

According to the heating control method described above, in the situation that the environment temperature is lower than the lower limit value of the normal operation temperature range, the chip 1 is automatically heated, so that its temperature can rise to a temperature within the normal operation temperature range. In addition, when the temperature of the chip 1 rises above the lower limit value of the normal operation temperature range, the heating power for the chip 1 can be adjusted to maintain the temperature of the chip 1 within a preset temperature range or at a preset temperature.

According to the above embodiments of the present invention, the electronic device using the heating circuit or the heating control method of the present invention can operate normally in region at high latitudes or in environments with extremely low temperatures, without the need to adopt industrial-grade or military-grade specifications. Therefore, the range of the use environment of the electronic device can be enlarged, which is conducive to the development of science and technology and the improvement of the convenience of life for human.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heating circuit disposed in a chip having a normal operation temperature range, comprising:
   a comparison circuit comparing a temperature voltage with a first threshold voltage, wherein the temperature voltage represents a temperature of the chip; and
   a thermal-energy generation circuit controlled by the comparison circuit, wherein when the temperature voltage is less than the first threshold voltage, the comparison circuit enables the thermal-energy generation circuit to generate thermal energy to raise the temperature of the chip.

2. The heating circuit as claimed in claim 1, wherein when the temperature of the chip rises above a lower limit value of the normal operation temperature range in response to the thermal energy, the thermal-energy generation circuit adjusts the thermal energy according to a power adjustment signal, so that the temperature of the chip is maintained within a preset temperature range within the normal operation temperature range.

3. The heating circuit as claimed in claim 1, wherein when the temperature voltage is greater than the first threshold voltage, the comparison circuit disables the thermal-energy generation circuit.

4. The heating circuit as claimed in claim 1, wherein the comparison circuit comprises:
a first comparator comparing the temperature voltage with the first threshold voltage to generate a heating control signal, and enabling the heating control signal when the temperature voltage is lower than the first threshold voltage; and
a second comparator comparing the temperature voltage with a second threshold voltage to generate a comparison signal and enabling the comparison signal when the temperature voltage is lower than the second threshold voltage, wherein the first threshold voltage is greater than the second threshold voltage,
wherein when the heating control signal is enabled, the thermal-energy generation circuit is enabled.

5. The heating circuit as claimed in claim 4, wherein the thermal-energy generation circuit comprises:
a transistor having a control electrode receiving the heating control signal, an input electrode coupled to a power source terminal, and an output electrode; and
a load circuit coupled between the output electrode of the transistor and a ground terminal,
wherein when the thermal-energy generation circuit is enabled according to the heating control signal, the load circuit generates a current flowing from the power source terminal to the ground terminal through the load circuit to generate the thermal energy.

6. The heating circuit as claimed in claim 5, wherein the load circuit comprises:
a variable resistor, coupled between the output electrode of the transistor and the ground terminal, having a resistance value,
wherein when the temperature of the chip rises above a lower limit value of the normal operation temperature range in response to the thermal energy, the variable resistor changes the resistance value according to a power adjustment signal, thereby adjusting the thermal energy, so that the temperature of the chip is maintained within a preset temperature range within the normal operation temperature range.

7. The heating circuit as claimed in claim 4, further comprising:
a resetting control circuit receiving the comparison signal and generating a reset signal according to the comparison signal;
wherein when a comparison result indicates that the temperature voltage is less than the second threshold voltage, the resetting control circuit generates the reset signal with a disabled voltage level so as not to boost up the chip, and
wherein when the comparison result indicates that the temperature voltage is greater than the second threshold voltage, the resetting control circuit generates the reset signal with an enable voltage level to boost up the chip.

8. The heating circuit as claimed in claim 7, wherein the resetting control circuit comprises:
an inverter receiving the comparison signal and generating the reset signal.

9. A chip comprising:
a temperature sensor sensing a temperature of the chip to generate a temperature voltage;
a heating circuit receiving the temperature voltage, comparing the temperature voltage with a first threshold voltage to generate a heating control signal, comparing the temperature voltage with a second threshold voltage, and generating a comparison signal according to a comparison result between the temperature voltage and the second threshold voltage, wherein the first threshold voltage is greater than the second threshold voltage; and
a processor coupled to the heating circuit, wherein the heating circuit provides the comparison signal as a reset signal to the processor,
wherein when the temperature voltage is less than the first threshold voltage, the heating circuit generates thermal energy to heat the chip according to the heading control signal, and
wherein when the temperature voltage is less than the second threshold voltage, the reset signal has a disabled voltage level to stop the processor from operating.

10. The chip as claimed in claim 9, further comprising:
an analog-to-digital converter receiving the temperature voltage and converting the temperature voltage to a digital temperature signal,
wherein the processor obtains the temperature of the chip according to the digital temperature signal.

11. The chip as claimed in claim 9, further comprising:
a power controller coupled to the heating circuit and the processor,
wherein when the temperature voltage is greater than the second threshold voltage, the reset signal has an enable voltage level that enables the processor to operate, and the processor generates a thermal-energy control signal, and
wherein the power controller generates a corresponding power adjustment signal in response to the thermal-energy control signal, and the heating circuit adjusts the thermal energy according to the power adjustment signal, so as to control heating power for the chip and maintain the temperature of the chip within a preset temperature range.

12. The chip as claimed in claim 9, wherein when the temperature voltage is greater than the first threshold voltage, the heating circuit stops generating the thermal energy.

13. The chip as claimed in claim 9, wherein the heating circuit comprises:
a comparison circuit comparing the temperature voltage with the first threshold voltage to generate the heating control signal and comparing the temperature voltage with the second threshold voltage to generate the comparison signal; and
a thermal-energy generation circuit controlled by the comparison circuit, wherein when the temperature voltage is less than the first threshold voltage, the thermal-energy generation circuit is enabled to generate the thermal energy according to the heating control signal.

14. The chip as claimed in claim 13, wherein the comparison circuit comprises:
a first comparator comparing the temperature voltage with the first threshold voltage to generate the heating control signal and enabling the heating control signal to enable the thermal-energy generation circuit when the temperature voltage is less than the first threshold voltage; and a second comparator comparing the temperature voltage with the second threshold voltage to generate the comparison signal and enabling the comparison signal when the temperature voltage is less than the second threshold voltage.

15. The chip as claimed in claim 14, wherein the heating circuit further comprises:
    a resetting control circuit, coupled to the second comparator to receive the comparison signal, generating the reset signal according to the comparison signal,
    wherein when the temperature voltage is less than the second threshold voltage, the resetting control circuit generates the reset signal with the disabled voltage level according to the enabled comparison signal to stop the processor from operating, and
    wherein when the temperature voltage is greater than the second threshold voltage, the resetting control circuit generates the reset signal having an enabled voltage level according to the comparison signal to enable the processor to operate.

16. The chip as claimed in claim 14, wherein the thermal-energy generation circuit comprises:
    a transistor having a control electrode receiving the heating control signal, an input electrode coupled to a power source terminal, and an output electrode; and
    a load circuit coupled between the output electrode of the transistor and a ground terminal,
    wherein when the thermal-energy generation circuit is enabled according to the heating control signal, the load circuit generates a current flowing from the power source terminal to the ground terminal through the load circuit, thereby generating the thermal energy.

17. The chip as claimed in claim 16, wherein the load circuit comprises:
    a variable resistor coupled between the output electrode of the transistor and the ground terminal and having a resistance value,
    wherein when the temperature voltage is greater than the second threshold voltage, the reset signal has an enabled voltage level to enable the processor to operate, and the processor generates a thermal-energy control signal, and
    wherein the resistance value of the variable resistor is changed according to the thermal energy control signal, thereby adjusting the thermal energy to maintain the temperature of the chip within a preset temperature range.

18. A heating control method for a chip, comprising:
    sensing a temperature of the chip;
    determining whether the temperature of the chip is higher than a first threshold temperature;
    determining whether the temperature of the chip is higher than a second temperature, wherein the second threshold temperature is lower than the first threshold temperature;
    in response to the temperature of the chip not being higher than the first threshold temperature, generating thermal energy to heat the chip; and
    in response to the temperature of the chip not being higher than the second threshold temperature, not boosting up the chip.

19. The heating control method as claimed in claim 18, further comprising:
    in response to the chip being heated which causes the temperature of the chip to be higher than the second threshold temperature, boosting up the chip and controlling heating power for the chip to maintain the temperature of the chip within a preset temperature range.

20. The heating control method as claimed in claim 18, further comprising:
    in response to the temperature of the chip being higher than the first threshold temperature, not generating energy.

* * * * *